(12) United States Patent
Hower et al.

(10) Patent No.: US 9,831,320 B2
(45) Date of Patent: Nov. 28, 2017

(54) HIGH VOLTAGE LATERAL DMOS TRANSISTOR WITH OPTIMIZED SOURCE-SIDE BLOCKING CAPABILITY

(71) Applicant: Texas Instruments Incorporated, Dallas, TX (US)

(72) Inventors: Philip Leland Hower, Concord, MA (US); Sameer Pendharkar, Allen, TX (US); Marie Denison, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/013,412

(22) Filed: Feb. 2, 2016

(65) Prior Publication Data

US 2016/0163855 A1    Jun. 9, 2016

Related U.S. Application Data

(62) Division of application No. 14/567,196, filed on Dec. 11, 2014, now Pat. No. 9,299,832.

(60) Provisional application No. 61/916,857, filed on Dec. 17, 2013.

(51) Int. Cl.
*H01L 29/66* (2006.01)
*H01L 21/336* (2006.01)
*H01L 29/78* (2006.01)
*H01L 29/08* (2006.01)
*H01L 29/10* (2006.01)
*H01L 29/06* (2006.01)
*H01L 21/266* (2006.01)
(Continued)

(52) U.S. Cl.
CPC ...... *H01L 29/66681* (2013.01); *H01L 21/266* (2013.01); *H01L 27/088* (2013.01); *H01L 29/063* (2013.01); *H01L 29/0619* (2013.01); *H01L 29/0623* (2013.01); *H01L 29/0634* (2013.01); *H01L 29/0642* (2013.01); *H01L 29/0646* (2013.01); *H01L 29/0692* (2013.01); *H01L 29/0696* (2013.01); *H01L 29/0878* (2013.01); *H01L 29/0886* (2013.01); *H01L 29/1095* (2013.01); *H01L 29/66659* (2013.01); *H01L 29/7816* (2013.01); *H01L 29/7835* (2013.01); *H01L 21/2253* (2013.01)

(58) Field of Classification Search
CPC ............... H01L 29/7816; H01L 21/266; H01L 29/66659; H01L 21/225; H01L 29/7835; H01L 29/0646; H01L 29/66681; H01L 29/0878; H01L 29/7809
USPC ......... 257/335, 336, 343, E29.256, E29.258; 438/286
See application file for complete search history.

(56) References Cited

U.S. PATENT DOCUMENTS

| | | | |
|---|---|---|---|
| 2007/0148874 A1 | 6/2007 | Nitta et al. | |
| 2008/0093641 A1* | 4/2008 | Ludikhuize | H01L 29/0634 257/289 |
| 2010/0006933 A1 | 1/2010 | Huang et al. | |

(Continued)

*Primary Examiner* — Fernando L Toledo
*Assistant Examiner* — Aaron Gray
(74) *Attorney, Agent, or Firm* — Tuenlap D. Chan; Charles A. Brill; Frank D. Cimino

(57) ABSTRACT

An integrated circuit and method having an extended drain MOS transistor with a buried drift region, a drain diffused link, a channel diffused link, and an isolation link which electrically isolated the source, where the isolation diffused link is formed by implanting through segmented areas to dilute the doping to less than two-thirds the doping in the drain diffused link.

20 Claims, 9 Drawing Sheets

(51) Int. Cl.
*H01L 27/088* (2006.01)
*H01L 21/225* (2006.01)

(56) References Cited

U.S. PATENT DOCUMENTS

2012/0112277 A1\* 5/2012 Denison .......... H01L 21/823814
257/337
2012/0223384 A1 9/2012 Huang et al.

\* cited by examiner

HIGH VOLTAGE LATERAL DMOS TRANSISTOR WITH OPTIMIZED SOURCE-SIDE BLOCKING CAPABILITY

CROSS-REFERENCE TO RELATED APPLICATIONS

Under 35 U.S.C. §§119(e) and 120-121, this divisional application claims the benefit of priority to U.S. patent application Ser. No. 14/567,196, filed on Dec. 11, 2014, which also claims the benefit of priority to U.S. Provisional Application 61/916,857, filed on Dec. 17, 2013, both of which are incorporated herein by reference in their entirety.

FIELD OF THE DISCLOSURE

This disclosure relates to the field of integrated circuits. More particularly, this disclosure relates to MOS transistors in integrated circuits.

BACKGROUND OF THE DISCLOSURE

An integrated circuit may contain a planar extended drain metal oxide semiconductor (MOS) transistor with a buried drift region, for example to provide an operating voltage above the dielectric strength of the gate dielectric layer in the MOS transistor. It may be desirable to form a low resistance drain portion connection between the buried drift region and the drain contact, a lightly doped channel portion link between the buried drift region and the channel of the MOS transistor, and a lightly doped isolation link between the buried drift region and the top surface of the substrate of the integrated circuit which electrically isolates the source and body of the MOS transistor from the substrate. It may further be desirable to minimize the number of photolithographic and ion implant operations in the fabrication sequence of forming the integrated circuit.

SUMMARY OF THE DISCLOSURE

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

An integrated circuit may include a planar extended drain MOS transistor with a buried drift region between the drain contact and the channel of the MOS transistor. A drain portion link between the buried drift region and the drain contact is formed concurrently with a channel portion link between the buried drift region and the channel and an isolation link between the buried drift layer and a top surface of a substrate of the integrated circuit. The isolation link electrically isolates a source diffused region and a body region of the extended drain MOS transistor from the substrate. The drain portion link, the channel portion link and the isolation link are formed by ion implanting dopants followed by an anneal operation which diffuses the implanted dopants to make an electrical connection with the buried drift region. The average doping density in the isolation link is less than two-thirds the average doping density in the drain portion link. The isolation link is formed by segmenting the ion implanted area so that the diffused dopant distributions of implanted segments in the isolation link are more diluted than in the drain portion link after the anneal operation.

DETAILED DESCRIPTION OF EXAMPLE EMBODIMENTS

Figure 1A:
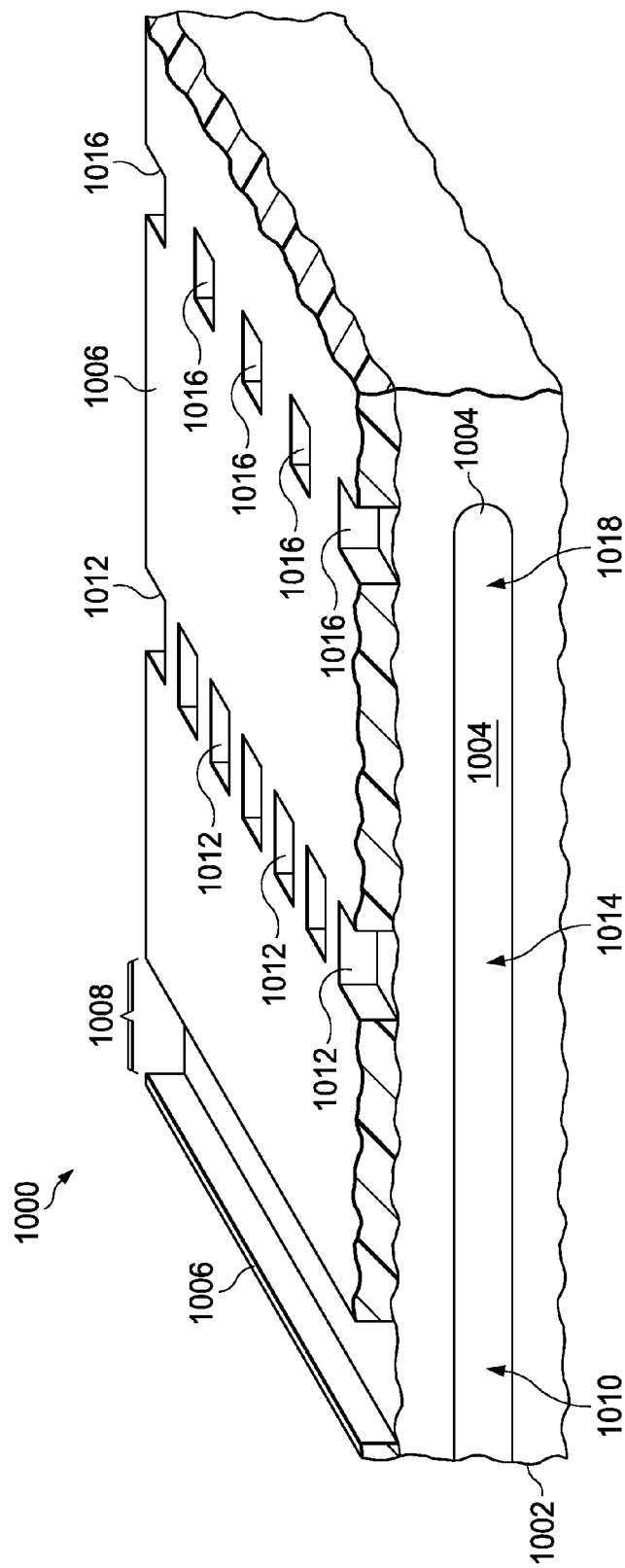
FIG. 1A through FIG. 1D are perspective views of an integrated circuit formed according to an example, depicted in successive stages of fabrication.

The following co-pending patent application is related and hereby incorporated by reference: U.S. patent application Ser. No. 14/567,398 filed concurrently with this application.

The present disclosure is described with reference to the attached figures, wherein like reference numerals are used throughout the figures to designate similar or equivalent elements. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

An integrated circuit may include a planar extended drain MOS transistor with a buried drift region in a substrate of the integrated circuit between a drain contact and a channel of the MOS transistor. A drain portion link between the buried drift region and the drain contact is formed concurrently with a channel portion link between the buried drift region and the channel, and an isolation link between the buried drift region and a top surface of the substrate, by ion implanting and annealing, which diffuses implanted dopants in each link to make electrical connections with the buried drift region. The isolation link is configured to electrically isolate a source diffused region and body region of the MOS transistor from the substrate. Ion implant areas in the isolation link are segmented so that dopants are diluted laterally during the anneal process, to reduce an average doping density compared to a non-segmented implanted area. Distributions of dopants of adjacent implanted segments in the isolation link overlap after the anneal operation. An average doping density in the isolation link is less than two-thirds the average doping density in the drain portion link. The segmentation of the ion implanted area for the isolation link may be adjusted to provide a desired breakdown voltage and series resistance of the MOS transistor.

In a first example, the isolation link extends laterally around the source diffused region and body region and connects to the channel portion link so as to electrically isolate the source diffused region and body region. In a second example, the channel portion link is configured in a closed loop which surrounds the drain portion link, and the isolation link is configured in a closed loop which surrounds the channel portion link, so that the source diffused region and body region are located between the channel portion link and the isolation link.

For the purposes of this description, the term "substantially equal" as applied to features of an integrated circuit is understood to mean equal within fabrication tolerances used to form the integrated circuit.

FIG. 1A through FIG. 1D are perspective views of an integrated circuit formed according to an example, depicted in successive stages of fabrication. Referring to FIG. 1A, the integrated circuit 1000 is formed in and on a p-type substrate 1002, which may be a single crystal silicon wafer, a silicon-on-insulator (SOI) wafer, a hybrid orientation technology (HOT) wafer with regions of different crystal orientations, or other material appropriate for fabrication of the integrated circuit 1000. An n-type buried drift region 1004 of a planar extended drain n-channel MOS transistor is formed in the substrate 1002. The buried drift region 1004 may be formed by ion implanting n-type dopants, for example phosphorus, into an existing top surface of the substrate 1002 followed by growing p-type epitaxial semiconductor material over the implanted n-type dopants. In one version of the instant example, a top surface of the buried drift region 1004 may be between 2 and 4 microns deep in the substrate 1002. A region of the substrate 1002 above the buried drift region 1004 may provide a RESURF region during operation of the integrated circuit 1000.

A link ion implant mask 1006 is formed over an existing top surface of the substrate 1002. The link ion implant mask 1006 may include photoresist and/or a dielectric layer such as silicon dioxide. The link ion implant mask 1006 has a drain open area 1008 over a drain portion 1010 of the buried drift region 1004. The link ion implant mask 1006 has a plurality of segmented channel open areas 1012 over a channel portion 1014 of the buried drift region 1004. The link ion implant mask 1006 further has a plurality of segmented isolation open areas 1016 over an isolation portion 1018 of the buried drift region 1004. The isolation portion 1018 extends past a subsequently formed source diffused region of the MOS transistor. In one version of the instant example, each segmented isolation open area 1016 may have lateral dimensions between 1.5 and 3.0 microns and be spaced between 4 and 7 microns apart. In one version of the instant example, the segmented isolation open areas 1016 and the segmented channel open areas 1012 may have substantially equal lateral dimensions and spacings. In another version, the segmented isolation open areas 1016 and the segmented channel open areas 1012 may have different lateral dimensions and spacings, as depicted in FIG. 1A. In one version of the instant example, the segmented isolation open areas 1016 and the segmented channel open areas 1012 may have linear configurations as depicted in FIG. 1A. In another version, the segmented isolation open areas 1016 and the segmented channel open areas 1012 may have curved configurations.

Figure 1B:
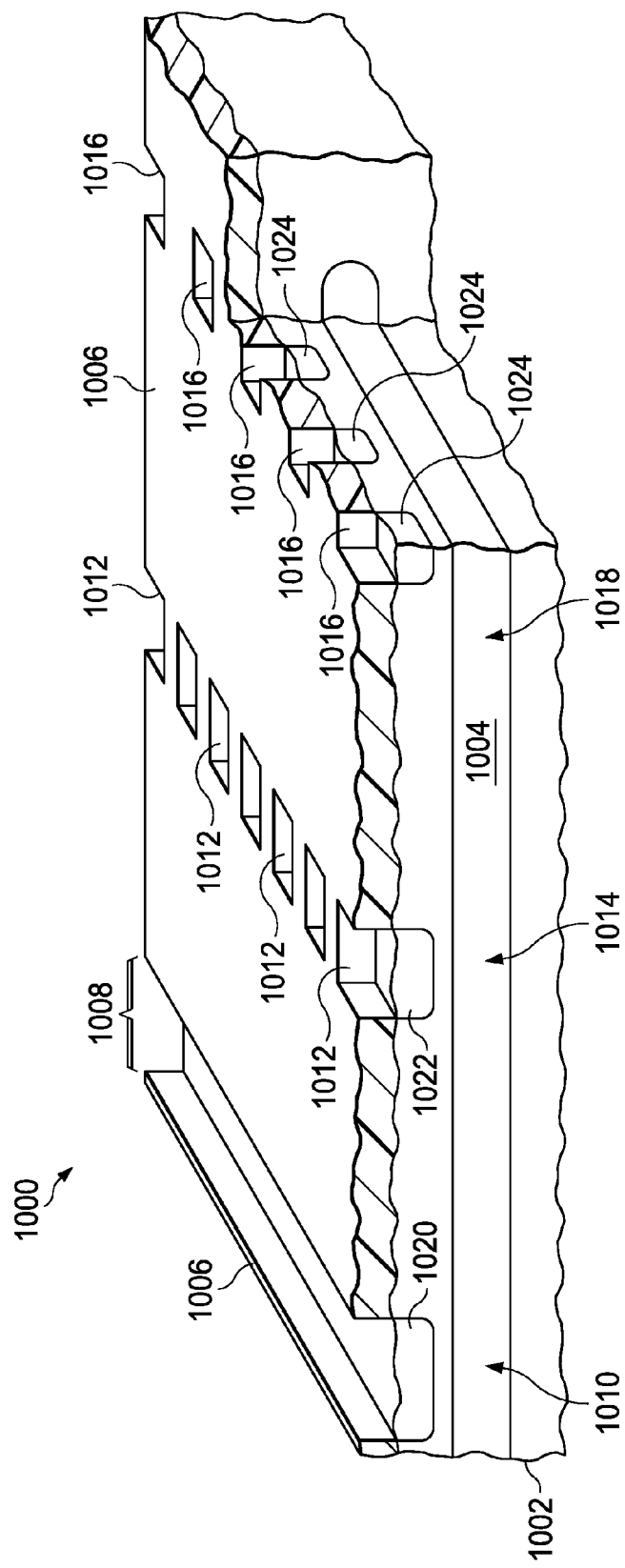

Referring to FIG. 1B, a link ion implant operation is performed on the integrated circuit 1000 which ion implants n-type dopants such as phosphorus and possibly arsenic through the drain open area 1008, the segmented channel open areas 1012 and the segmented isolation open areas 1016 of the link ion implant mask 1006, concurrently, into the substrate 1002. In one version of the instant example, the link ion implant operation may have a dose between $8 \times 10^{12}$ cm$^{-2}$ and $1.5 \times 10^{13}$ cm$^{-2}$. The link ion implant operation concurrently forms a drain link implanted region 1020 under the drain open area 1008, channel link implanted regions 1022 under the segmented channel open areas 1012, and isolation link implanted regions 1024 under the segmented isolation open areas 1016. In one version of the instant example, the isolation link implanted regions 1024 do not touch or overlap each other. The link ion implant operation may be performed as two or more sub-implants at different energies, for example to provide a more uniform vertical distribution of the implanted dopants.

Figure 1C:
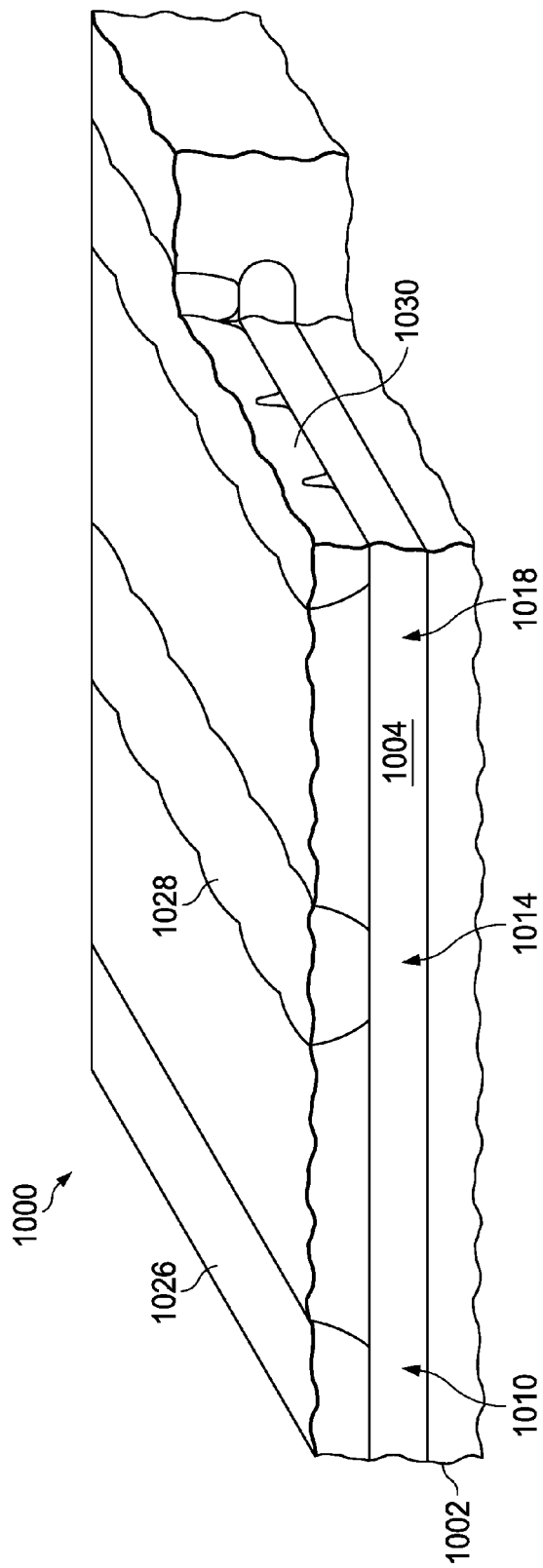

Referring to FIG. 1C, an anneal operation is performed on the integrated circuit 1000 which diffuses the dopants in the drain link implanted region 1020 of FIG. 1B to form a drain diffused link 1026 which extends to, and makes an electrical connection with, the buried drift region 1004 at the drain portion 1010. The anneal operation also diffuses the dopants in the channel link implanted regions 1022 of FIG. 1B to form a channel diffused link 1028 which extends to, and makes an electrical connection with, the buried drift region 1004 at the channel portion 1014. Further, the anneal operation diffuses the dopants in the isolation link implanted regions 1024 of FIG. 1B to form an isolation diffused link 1030 which extends to, and makes an electrical connection with, the buried drift region 1004 at the isolation portion 1018. In one version of the instant example, diffused regions from adjacent isolation link implanted regions 1024 overlap to form a contiguous isolation diffused link 1030 as depicted in FIG. 1C. In an alternate version, gaps may exist between the diffused regions from adjacent isolation link implanted regions 1024, such that during operation of the MOS transistor, depletion regions around the diffused regions of the isolation diffused link 1030 overlap to electrically isolate a source diffused region of the MOS transistor from the substrate 1002. An average doping density in the isolation diffused link 1030 is less than two-thirds an average doping density in the drain diffused link 1026. In one version of the instant example, the average doping density in the isolation diffused link 1030 may be between 20 percent and 50 percent of the average doping density in the drain diffused link 1026. In a further version, the average doping density in the isolation diffused link 1030 may be between 25 percent and 33 percent of the average doping density in the drain diffused link 1026. In one version of the instant example, the average doping density in the drain diffused link 1026 may be between $2.5 \times 10^{16}$ cm$^{-3}$ and $3.5 \times 10^{16}$ cm$^{-3}$, and the average doping density in the isolation diffused link 1030 may be between $5 \times 10^{15}$ cm$^{-3}$ and $1 \times 10^{16}$ cm$^{-3}$.

Figure 1D:
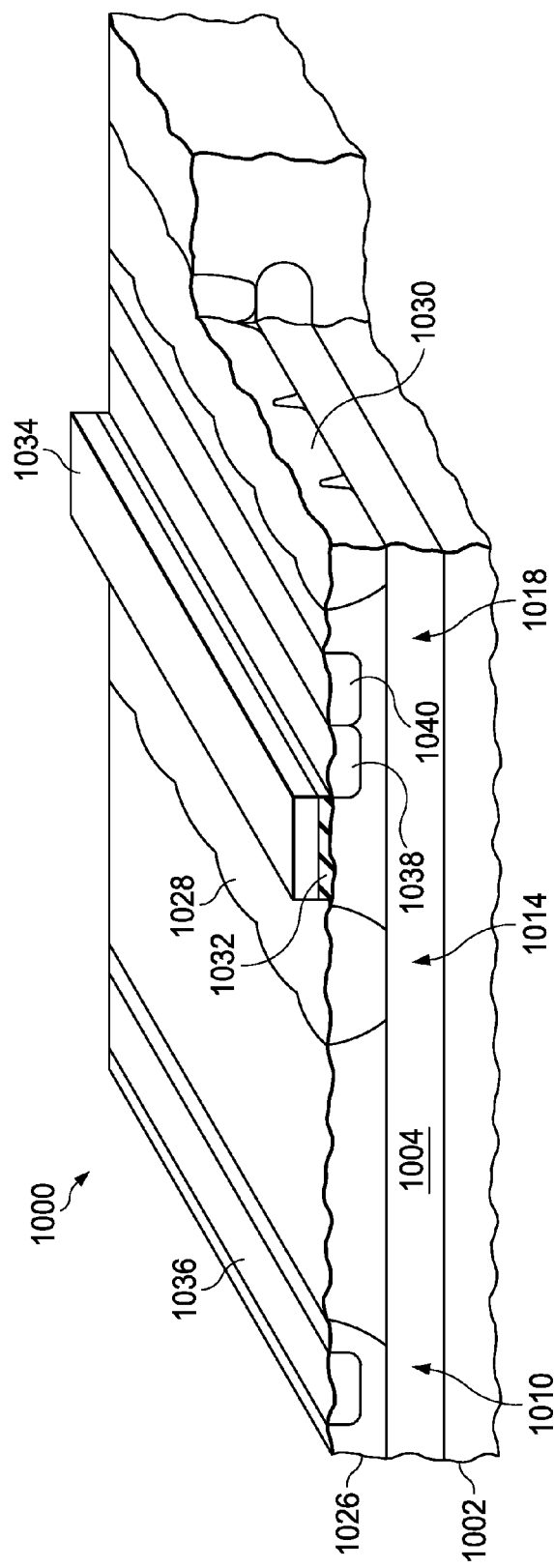

Referring to FIG. 1D, a gate dielectric layer 1032 of the MOS transistor is formed on the substrate 1002 between the channel diffused link 1028 and the isolation diffused link 1030. A gate 1034 of the MOS transistor is formed on the gate dielectric layer 1032. A drain diffused region 1036 is formed in the substrate 1002 at a top of the drain diffused link 1026. A source diffused region 1038 is formed in the substrate 1002 adjacent to the gate 1034, opposite the channel diffused link 1028, and between the channel diffused link 1028 and the isolation diffused link 1030. A back gate contact diffused region 1040 is formed in the substrate 1002 between the channel diffused link 1028 and the isolation diffused link 1030. During operation of the integrated circuit 1000, the channel diffused link 1028 provides an electrical connection from the buried drift region 1004 to a channel under the gate dielectric layer 1032. The isolation diffused link 1030 in combination with the buried drift region 1004 electrically isolates the source diffused region 1038 from the substrate 1002 outside the MOS transistor. Lateral dimensions and spacing of the segmented isolation open areas 1016 of FIG. 1B may be adjusted to provide a desired breakdown voltage of the MOS transistor.

It will be recognized that a p-channel version of the MOS transistor described in reference to FIG. 1A through FIG. 1D may be formed with appropriate reversals of doping polarities. It will be recognized that a second planar extended drain MOS transistor with a buried drift region may be formed in the integrated circuit 1000, so that an isolation diffused link of the second MOS transistor is formed concurrently with the isolation diffused link 1030 of the first MOS transistor, with a different configuration of segmented channel end open areas, so as to provide a breakdown different from the first MOS transistor with no additional process operations.

Figure 2A:
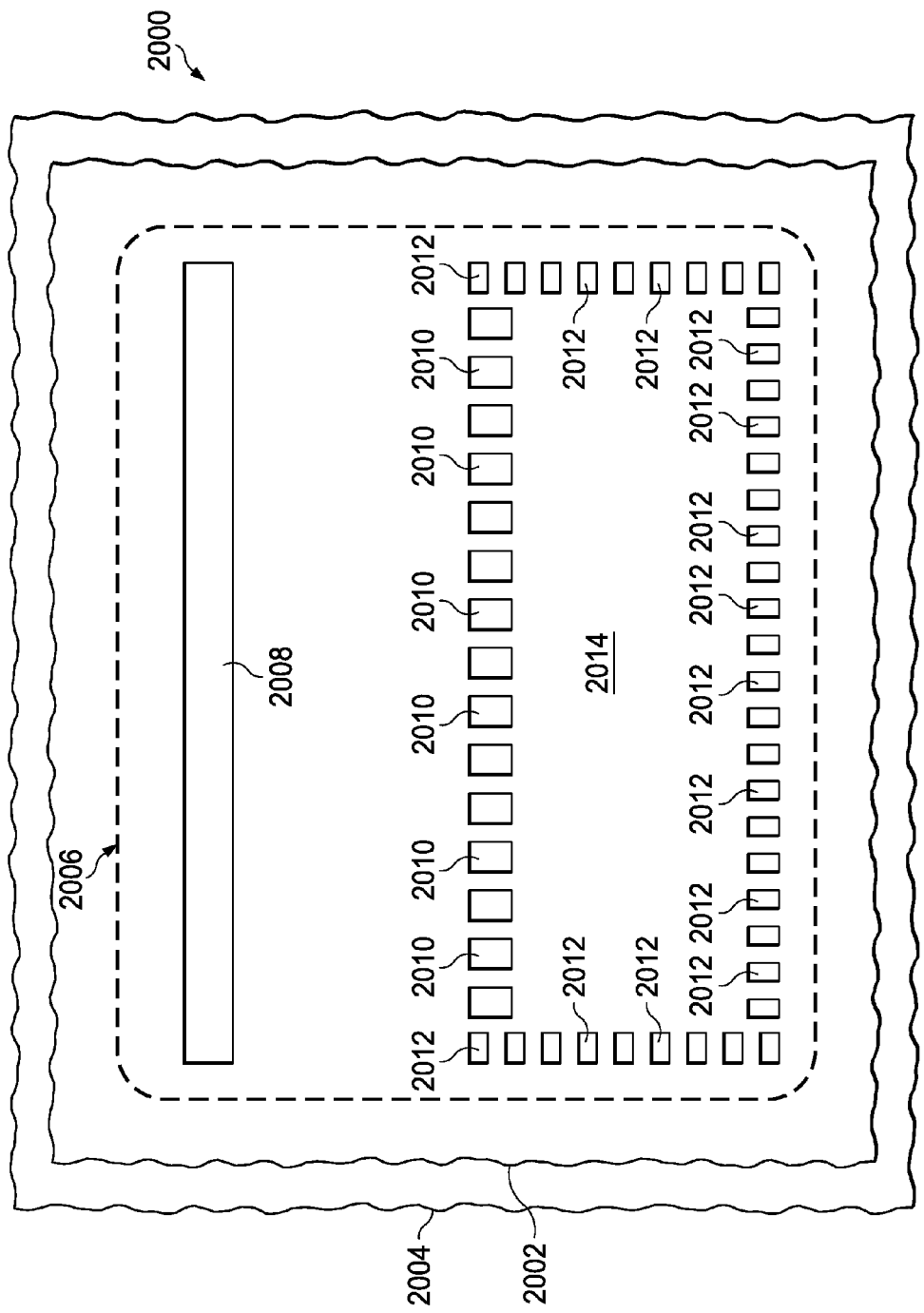
FIG. 2A and FIG. 2B are top views of an integrated circuit containing a planar extended drain MOS transistor formed according to the first example, depicted in successive stages of fabrication.
Figure 2B:
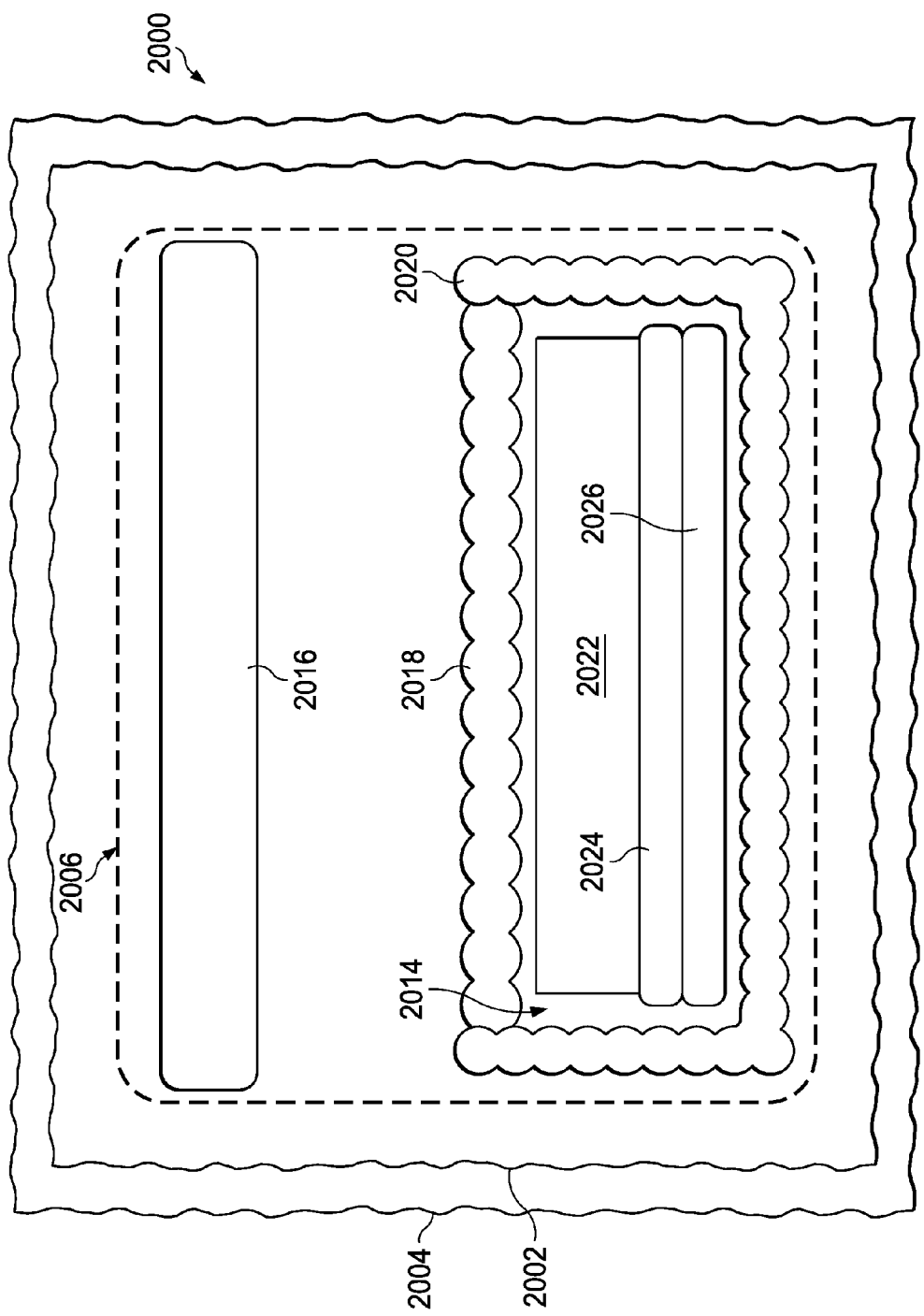

FIG. 2A and FIG. 2B are top views of an integrated circuit containing a planar extended drain MOS transistor formed according to the first example, depicted in successive stages of fabrication. Referring to FIG. 2A, the integrated circuit 2000 has a link ion implant mask 2002 formed over a substrate 2004 on which the integrated circuit 2000 is formed. A buried drift region 2006 has been formed in the substrate 2004. The link ion implant mask 2002 has a linear drain end open area 2008 over a drain portion of the buried drift region 2006. The link ion implant mask 2002 also has a linear array of segmented channel open areas 2010 over a channel portion of the buried drift region 2006 and a plurality of segmented isolation open areas 2012 over an isolation portion of the buried drift region 2006. The segmented isolation open areas 2012 extend laterally to the segmented channel open areas 2010 so as to laterally enclose a source area 2014. A link ion implant operation is performed on the integrated circuit 2000 which ion implants dopants through the drain open area 2008, the segmented channel open areas 2010 and the segmented isolation open areas 2012, concurrently, into the substrate 2004, to form a drain link implanted region, not shown, under the drain open area 2008, channel link implanted regions, not shown, under the segmented channel open areas 2010, and isolation link implanted regions, not shown, under the segmented isolation open areas 2012, as described in reference to FIG. 1B.

Referring to FIG. 2B, an anneal operation is performed on the integrated circuit 2000 which diffuses the dopants in the drain link implanted region to form a drain diffused link 2016 which extends to, and makes an electrical connection with, the buried drift region 2006 as described in reference to FIG. 1C. The anneal operation also diffuses the dopants in the channel link implanted regions to form a channel diffused link 2018 which extends to, and makes an electrical connection with, the buried drift region 2006 as described in reference to FIG. 1C. Further, the anneal operation diffuses the dopants in the isolation link implanted regions to form an isolation diffused link 2020 which extends to, and makes an electrical connection with, the buried drift region 2006 as described in reference to FIG. 1C. Subsequently, a gate 2022, source diffused region 2024 and optional back gate diffused contact region 2026 are formed in the source area 2014.

In the instant example, the isolation diffused link 2020 extends laterally around the source area 2014 and contacts the channel diffused link 2018 so as to electrically isolate the source diffused region 2024 from the substrate 2004 outside the MOS transistor. It will be recognized that other isolating elements such as deep trench isolation elements filled with silicon dioxide may also be used in combination with the isolation diffused link 2020 to electrically isolate the source diffused region 2024.

Figure 3A:
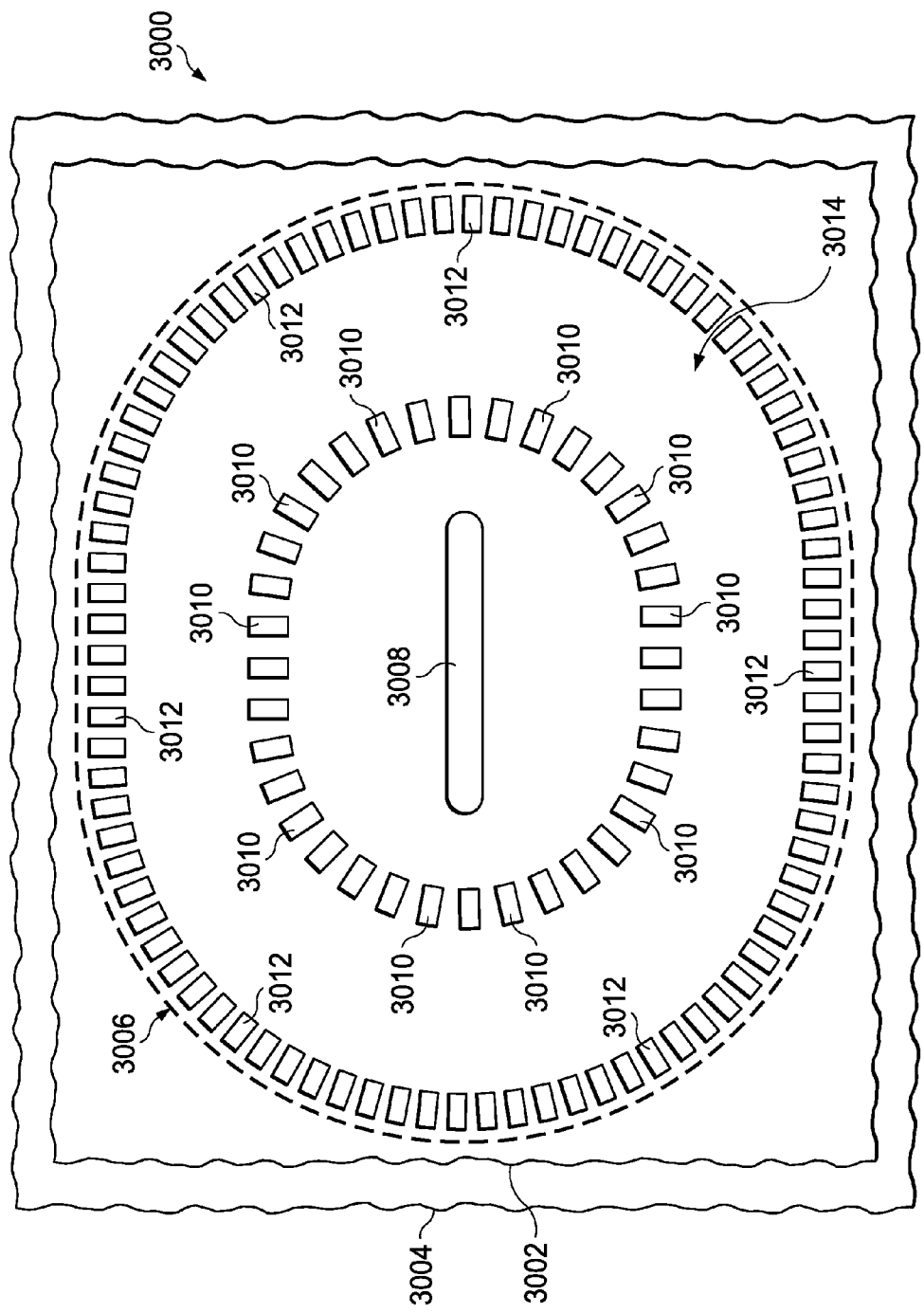
FIG. 3A and FIG. 3B are top views of an integrated circuit containing a planar extended drain MOS transistor formed according to the second example, depicted in successive stages of fabrication.
Figure 3B:
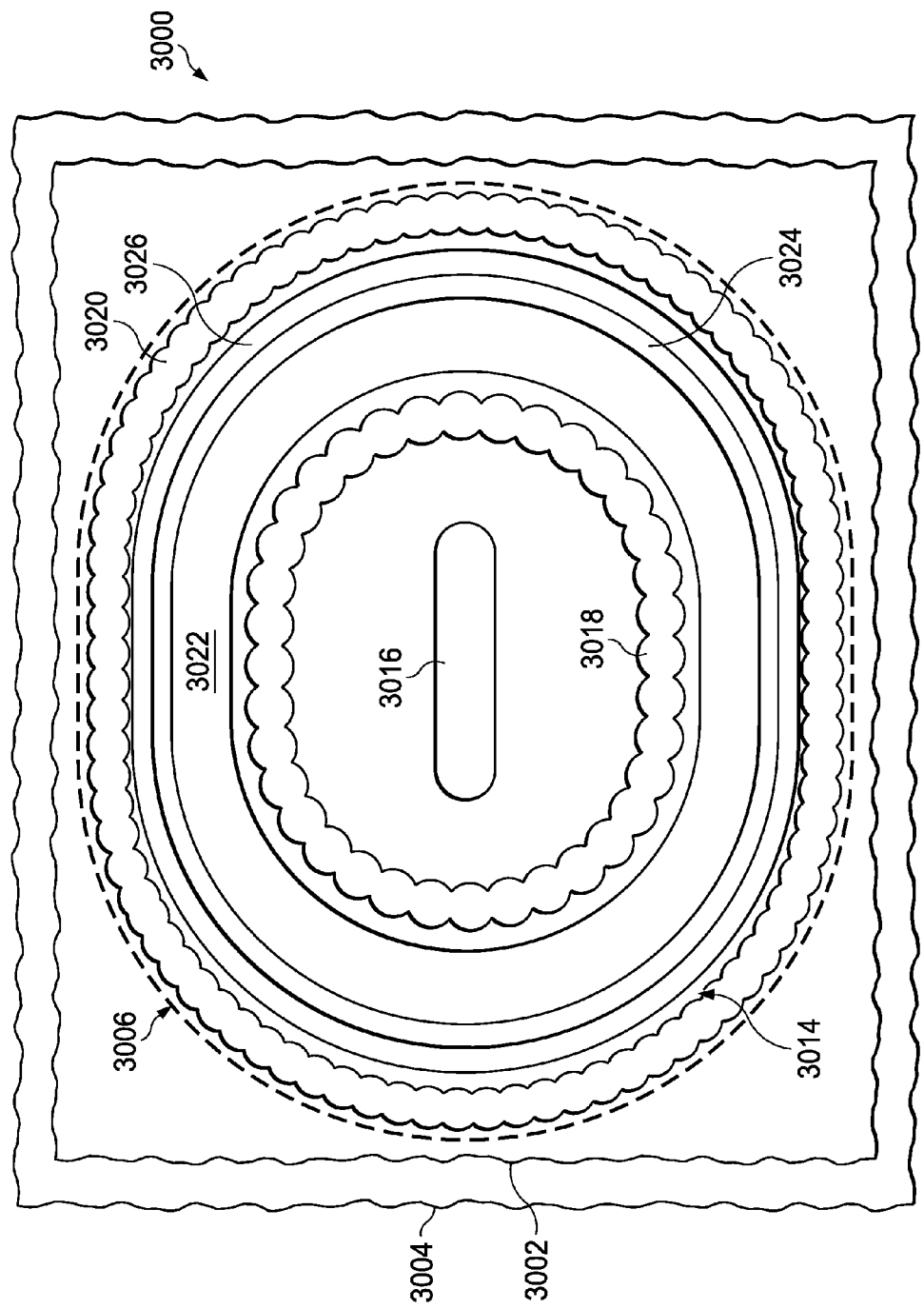

FIG. 3A and FIG. 3B are top views of an integrated circuit containing a planar extended drain MOS transistor formed according to the second example, depicted in successive stages of fabrication. Referring to FIG. 3A, the integrated circuit 3000 has a link ion implant mask 3002 formed over a substrate 3004 on which the integrated circuit 3000 is formed. A buried drift region 3006 has been formed in the substrate 3004. The link ion implant mask 3002 has a drain open area 3008 over a drain portion of the buried drift region 3006. The link ion implant mask 3002 also has an array of segmented channel open areas 3010 over a channel portion of the buried drift region 3006 around the drain open area 3008, and a closed loop array of segmented isolation open areas 3012 over an isolation portion of the buried drift region 3006. The array of segmented channel open areas 3010 may have a closed loop configuration as depicted in FIG. 3A. The segmented isolation open areas 3012 laterally surround the segmented channel open areas 3010 so as to laterally enclose a source area 3014 between the segmented channel open areas 3010 and the segmented isolation open areas 3012. A link ion implant operation is performed on the integrated circuit 3000 which ion implants dopants through the drain open area 3008, the segmented channel open areas 3010 and the segmented isolation open areas 3012, concurrently, into the substrate 3004, to form a drain link implanted region, not shown, under the drain open area 3008, channel link implanted regions, not shown, under the segmented channel open areas 3010, and isolation link implanted regions, not shown, under the segmented isolation open areas 3012, as described in reference to FIG. 1B.

Referring to FIG. 3B, an anneal operation is performed on the integrated circuit 3000 which diffuses the dopants in the drain link implanted region to form a drain diffused link 3016 which extends to, and makes an electrical connection with, the buried drift region 3006 as described in reference to FIG. 1C. The anneal operation also diffuses the dopants in the channel link implanted regions to form a channel diffused link 3018 which extends to, and makes an electrical connection with, the buried drift region 3006 as described in reference to FIG. 1C. Further, the anneal operation diffuses the dopants in the isolation link implanted regions to form an isolation diffused link 3020 which extends to, and makes an electrical connection with, the buried drift region 3006 as described in reference to FIG. 1C. Subsequently, a gate 3022, source diffused region 3024 and optional back gate diffused contact region 3026 are formed in the source area 3014.

In the instant example, the channel diffused link 3018, the gate 3022, the source diffused region 3024, the optional back gate diffused contact region 3026 if present and the isolation diffused link 3020 are configured as concentric racetrack shaped closed loops, so that the isolation diffused link 3020 electrically isolates the source diffused region 3024 from the substrate 3004 outside the MOS transistor. It will be recognized that other closed loop shapes, such as circular, rectangular, or fingered shapes may be used.

Figure 4:
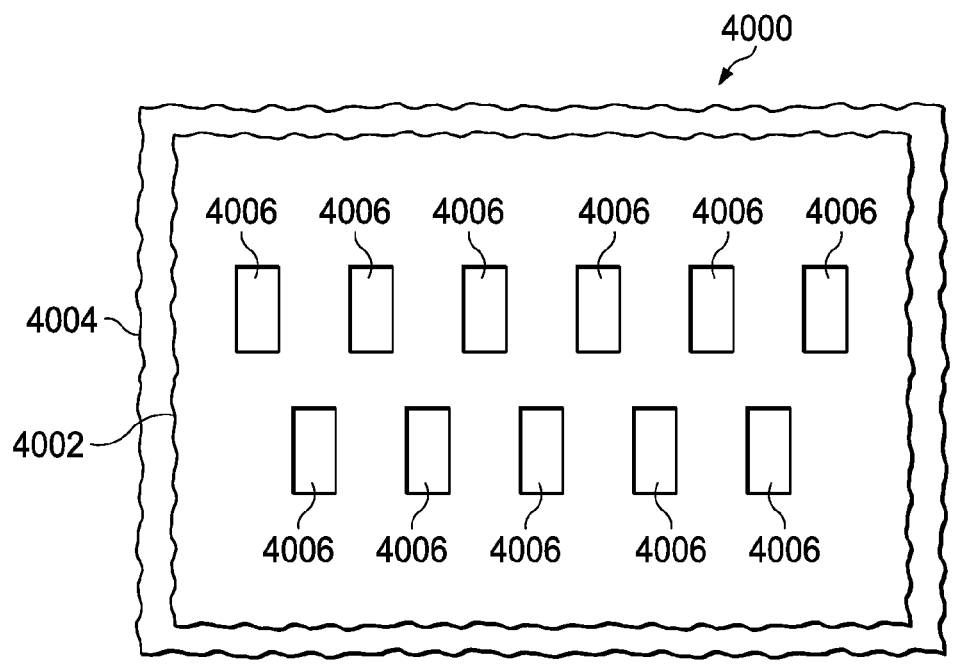
FIG. 4 is a top view of an integrated circuit containing a planar extended drain MOS transistor formed according to an example, depicted after formation of a link ion implant mask.

FIG. 4 is a top view of an integrated circuit containing a planar extended drain MOS transistor formed according to an example, depicted after formation of a link ion implant mask. The integrated circuit 4000 has the link ion implant mask 4002 formed over a substrate 4004 on which the integrated circuit 4000 is formed. The link ion implant mask 4002 has segmented isolation open areas 4006. The segmented isolation open areas 4006 are disposed in a staggered configuration, for example to obtain a desired doping density and total width of an isolation diffused link subsequently formed below the isolation open areas 4006. It will be recognized that a staggered configuration of segmented isolation open areas may be formed in an MOS transistor with a non-linear isolation diffused link, such as a circular or racetrack shaped isolation diffused link.

Figure 5:
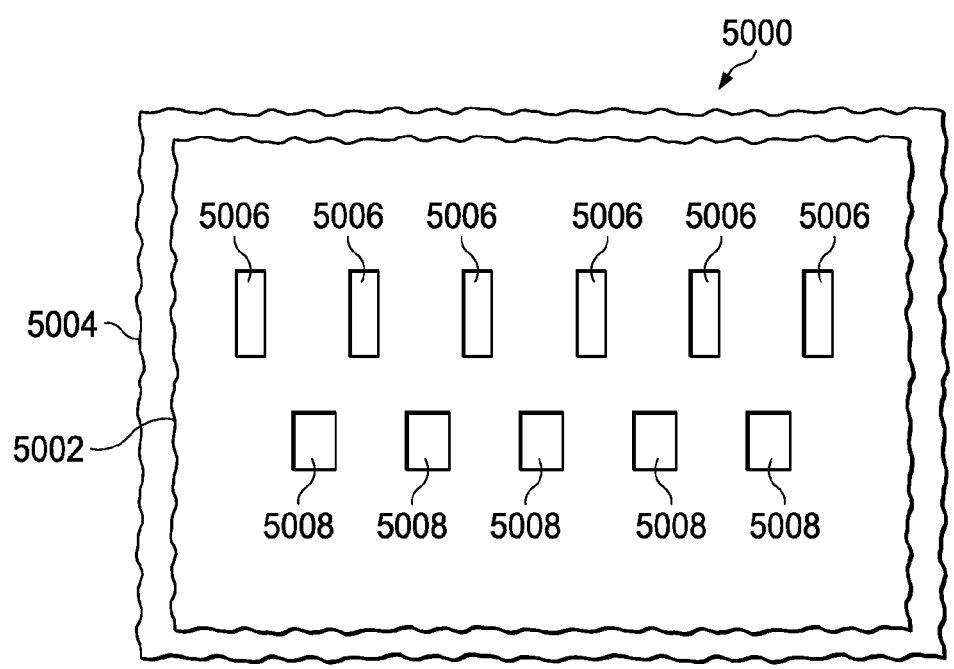
FIG. 5 is a top view of an integrated circuit containing a planar extended drain MOS transistor formed according to an example, depicted after formation of a link ion implant mask.

FIG. 5 is a top view of an integrated circuit containing a planar extended drain MOS transistor formed according to an example, depicted after formation of a link ion implant mask. The integrated circuit 5000 has the link ion implant mask 5002 formed over a substrate 5004 on which the integrated circuit 5000 is formed. The link ion implant mask 5002 has a plurality of first segmented isolation open areas 5006 with a first length and first width, and a plurality of second segmented isolation open areas 5008 with a second length and second width. The first segmented isolation open areas 5006 in combination with the second segmented isolation open areas 5008 may provide, for example, an advantageous grading of a doping density in an isolation diffused link subsequently formed below the first and second segmented isolation open areas 5006 and 5008. It will be recognized that a staggered configuration of segmented isolation open areas may be formed in an MOS transistor with a non-linear isolation diffused link, such as a circular or racetrack shaped isolation diffused link.

While various examples of the present disclosure have been described above, it should be understood that they have been presented by way of example only and not limitation. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the following claims and their equivalents.

What is claimed is:

1. An integrated circuit, comprising:
a substrate of a first conductivity type;
a buried drift region of a second conductivity type opposing the first conductivity type, the buried drift region positioned in the substrate;
an epitaxial layer of the first conductivity type on the buried drift region and extending to a top surface of the substrate;
a gate dielectric layer abutting the top surface of the substrate;
a drain link extending from the epitaxial layer to connect with the buried drift region; and
a channel link extending from the epitaxial layer to connect with the buried drift region, the channel link spaced apart from the drain link by a segment of the epitaxial layer free of the second conductivity type at the top surface.

2. The integrated circuit of claim 1, wherein the drain link is diffused with dopants of the second conductivity type, and the channel link is diffused with the dopants of the second conductivity type.

3. The integrated circuit of claim 1, further comprising:
a RESURF region of the first conductivity type positioned in the epitaxial layer and separating the drain link from the channel link.

4. The integrated circuit of claim 3, wherein the RESURF region extends from a top surface of the epitaxial layer to abut the buried drift region.

5. The integrated circuit of claim 1, further comprising:
a source diffused region positioned above the buried drift region; and
an isolation link of the second conductivity type, the isolation link extending from the epitaxial layer to connect with the buried drift region, the isolation link laterally surrounding the source diffused region with the channel link.

6. The integrated circuit of claim 5, wherein:
the channel link laterally surrounds the drain link; and
the isolation link laterally surrounds the channel link and the drain link.

7. The integrated circuit of claim 5, wherein the isolation link includes a nonlinear array of diffused regions laterally surrounding the source diffused region with the channel link.

8. The integrated circuit of claim 5, wherein the isolation link includes a staggered array of diffused regions laterally surrounding the source diffused region with the channel link.

9. The integrated circuit of claim 1, wherein:
the drain link includes a linear diffused region;
the channel link includes a linear array of diffused regions parallel to the linear diffused region.

10. The integrated circuit of claim 1, wherein:
the drain link includes a linear diffused region;
the channel link includes a nonlinear array of diffused regions laterally surrounding the linear diffused region.

11. An extended drain transistor, comprising:
a substrate having a top surface;
a gate dielectric layer on the top surface;
a buried drift region positioned in the substrate;
a drain link extending from the top surface to the buried drift region;
a channel link extending from the top surface to the buried drift region; and
a RESURF region extending from the top surface and above the buried drift region, the RESURF region separating the drain link from the channel link at the top surface, wherein the RESURF region has a first conductivity type and excludes a second conductivity type of the drain link and the channel link.

12. The extended drain transistor of claim 11, further comprising:
a source diffused region positioned above the buried drift region; and
an isolation link extending from the top surface to the buried drift region, the isolation link laterally surrounding the source diffused region with the channel link.

13. The extended drain transistor of claim 12, wherein the isolation link includes a nonlinear array of diffused regions laterally surrounding the source diffused region with the channel link.

14. The extended drain transistor of claim 12, wherein the isolation link includes a staggered array of diffused regions laterally surrounding the source diffused region with the channel link.

15. The extended drain transistor of claim 12, wherein:
the channel link laterally surrounds the drain link; and
the isolation link laterally surrounds the channel link and the drain link.

16. The extended drain transistor of claim 11, wherein:
the drain link includes a linear diffused region;
the channel link includes a linear array of diffused regions parallel to the linear diffused region.

17. The extended drain transistor of claim 11, wherein:
the drain link includes a linear diffused region;
the channel link includes a nonlinear array of diffused regions laterally surrounding the linear diffused region.

18. An integrated circuit, comprising:
a substrate having a top surface;
a gate dielectric layer on the top surface;
a buried drift region positioned in the substrate;
a drain link extending from the top surface to the buried drift region;
a channel link extending from the top surface to the buried drift region;
a RESURF region extending from the top surface and above the buried drift region, the RESURF region separating the drain link from the channel link at the top surface, wherein the RESURF region has a first conductivity type and excludes a second conductivity type of the drain link and the channel link;
a source diffused region formed near the top surface and above the buried drift region, the source diffused region opposing the channel link; and
an isolation link extending from the top surface to the buried drift region, the isolation link laterally surrounding the source diffused region with the channel link.

19. The integrated circuit of claim 18, wherein:
the drain link includes a linear diffused region;
the channel link includes a linear array of diffused regions parallel to the linear diffused region.

20. The integrated circuit of claim 18, wherein:
the drain link includes a linear diffused region;
the channel link includes a nonlinear array of diffused regions laterally surrounding the linear diffused region.

* * * * *